US005576763A

United States Patent [19]

Ackland et al.

[11] Patent Number: 5,576,763
[45] Date of Patent: Nov. 19, 1996

[54] SINGLE-POLYSILICON CMOS ACTIVE PIXEL

[75] Inventors: Bryan D. Ackland, Old Bridge; Alexander G. Dickinson, Neptune; El-Sayed I. Eid, Freehold; David A. Inglis, Long Branch, all of N.J.

[73] Assignee: Lucent Technologies Inc., Murray Hill, N.J.

[21] Appl. No.: 344,785

[22] Filed: Nov. 22, 1994

[51] Int. Cl.[6] .................................................. H04N 5/335
[52] U.S. Cl. .......................... 348/308; 348/294; 257/290
[58] Field of Search ...................................... 348/294, 302, 348/303, 307, 308, 311, 313; 257/290, 234, 239, 72, 369; 377/60; H04N 5/335

[56] References Cited

U.S. PATENT DOCUMENTS 5,436,476  7/1995  Hynecek ................................. 257/223
5,471,515  11/1995  Fossum et al. .......................... 377/60

OTHER PUBLICATIONS

Fossum, E. R., "Active Pixel Sensors: Are CCD's Dinosaurs?," Proceedings of the SPIE, vol. 1900, *Charge--Coupled Devices and Solid State Optical Sensors III*, Feb. 2-3, 1993, San Jose, California, pp. 2-14.
Fossum, E. R., "Assessment of Image Sensor Technology for Future Nasa Missions," Proceedings of the SPIE, vol. 2172, *Charge-Coupled Devices and Solid State Optical Sensors IV*, pp. 1-16.
Mendis, S., et al., "CMOS Active Pixel Image Sensor," IEEE Transactions on Electron Devices, vol. 41, No. 3, Mar. 1994, pp. 452-453.

Mendis, S. K., et al., "CMOS Active Pixel Image Sensors For Highly Integrated Imaging Systems," Prepublication copy; accepted for publication by IEEE Journal of Solid State Circuits, 18 pages.

*Primary Examiner*—Wendy Garber
*Assistant Examiner*—Tuan V. Ho

[57] ABSTRACT

The single-polysilicon active pixel comprises a photo site located on a substrate for generating and storing charge carriers, the charge carriers being generated from photonic energy incident upon the photo site and semiconductor substrate, a photo gate, a transfer transistor and output and reset electronics. The gate of the transfer transistor and the photo gate are defined in a single layer of polysilicon disposed on the semiconductor substrate. The source of transfer transistor is a doped region of substrate, referred to as a coupling diffusion, which provides the electrical coupling between the photo gate and the transfer transistor. The coupling diffusion allows for the transfer of a signal stored in a photo site under the photo gate to the output electronics for processing. The single-polysilicon active pixel may be operated by biasing the transfer transistor to the low operating voltage of the pixel, for example, 0 volts. By virtue of the structure of the single-polysilicon active pixel, this mode of operation results in the same timing as if the transfer transistor were clocked, but neither a clock nor the associated driving circuitry are required. However, there is little no tendency for image lag as occurs in double polysilicon active pixels when they are operated in a manner which avoids clocking the transfer gate.

16 Claims, 3 Drawing Sheets

5,576,763

SINGLE-POLYSILICON CMOS ACTIVE PIXEL

FIELD OF THE INVENTION

This invention relates generally to CMOS active pixels, and more particularly to a single polysilicon active pixel.

BACKGROUND OF THE INVENTION

A CMOS active pixel is a semiconductor device capable of converting optical images into electronic signals. Such active pixels may be used in imaging devices such as video cameras. The CMOS active pixel comprises a photo site and associated read-out and resetting electronics. As photons strike a photo site, free charge carriers are generated in an amount linearly proportional to the incident photon radiation. These photogenerated charge carriers are collected in the photo site via a photo gate. The collected charge carriers form an electrical charge packet. The amount of charge contained in the charge packet is thus a representation of the intensity of the light striking the photo site.

The charge packet is stored in the photo site in spatially defined depletion regions or potential wells in the semiconductor substrate beneath the photo site. The charge packet must be moved from the depletion region under the photo site to the output circuitry for processing. This move may be accomplished by transferring the charge packet to a second, adjacent well that is located beneath a transfer gate. The transfer gate well receives the charge from the photo gate well and further transfers it to the output circuitry for processing.

Charge packet transfer between wells typically occurs in the following manner. The near-surface potential within the semiconductor can be controlled by the potential of an electrode that is in close proximity to the semiconductor surface. If closely spaced electrodes are at different voltages, they will form potential wells of different depths. Free positive charges, for example, holes, will move from the region of higher potential to the one of lower potential. Free negative charges, for example, electrons, will move from the region of lower potential to one of higher potential. Accordingly, the potential on the photo gate and transfer gate may be adjusted to effect charge movement.

There is necessarily a gap between the photo gate and the transfer gate. If the gap is not narrow enough, the surface potential under the gap will constitute an electrical potential barrier for the transfer of the charge packet. If this occurs, there is no charge transfer. In other words, there is no signal read-out. Photolithographic techniques presently dictate that a two layer polysilicon structure is required to achieve a sufficiently narrow gap between surface electrodes.

It would be desirable to form an active pixel using a process wherein only one polysilicon deposition is required. This simple process would result in lower per chip fabrication cost. Furthermore, it would be desirable to operate such a pixel in a manner that minimizes hardware requirements while maintaining optimal pixel performance.

SUMMARY OF THE INVENTION

A single-polysilicon active pixel formed based on a single polysilicon deposition, and a method for operating the single-polysilicon active pixel are disclosed. According to one aspect of the present invention, the single-polysilicon active pixel comprises a photo site, a photo gate, a transfer transistor, and output and reset electronics. The source of the transfer transistor may be a doped region of substrate, referred to as a coupling diffusion, which provides the electrical coupling between the photo gate and the transfer transistor. The coupling diffusion allows for the transfer of a signal stored in the photo site under the photo gate to the output electronics for processing.

According to another aspect the invention, the single-polysilicon active pixel may be operated by biasing the transfer transistor to the low operating voltage of the pixel, for example, 0 volts. By virtue of the structure of the single-polysilicon active pixel, this mode of operation results in the same timing as if the transfer transistor were clocked, which it is not, so that neither a clock nor the associated driving circuitry are required. However, there is little or no tendency for image lag as occurs in double polysilicon active pixels when they are operated in a manner which avoids clocking the transfer gate.

Further features of the present invention will become more apparent from the following detailed description when read in conjunction with the accompanying drawings.

DETAILED DESCRIPTION OF THE INVENTION

Figure 3:
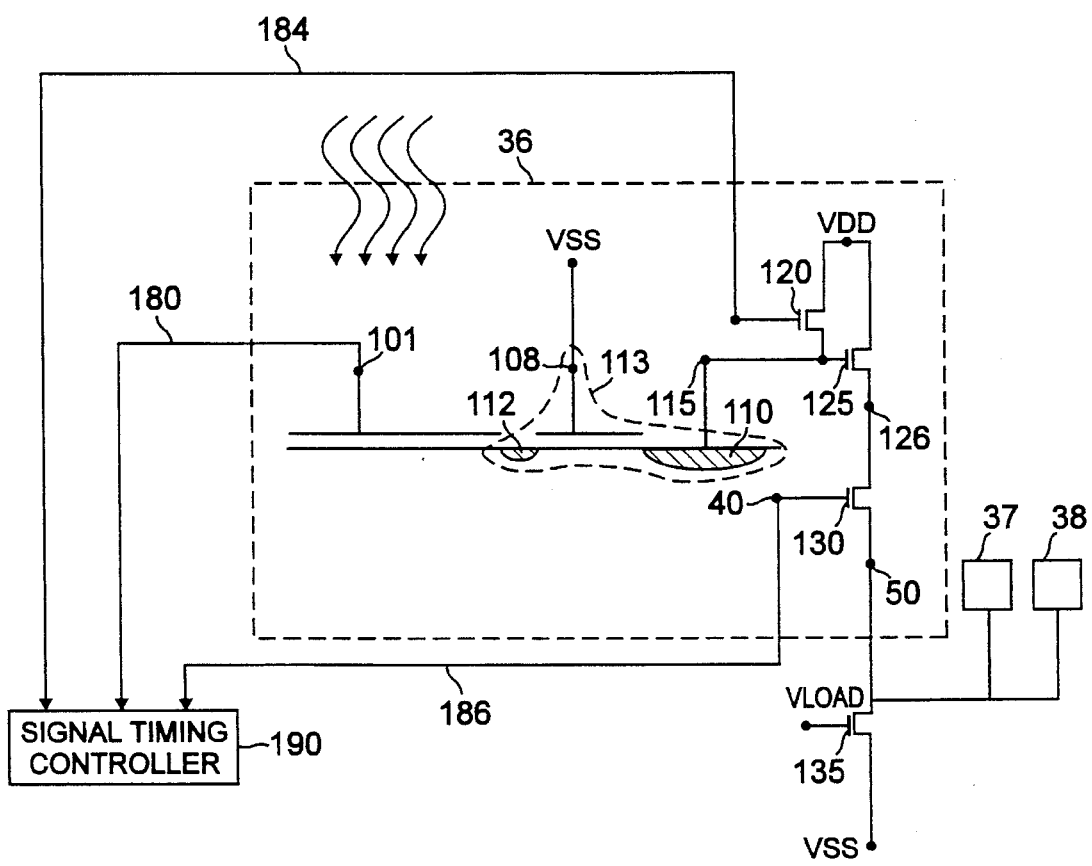
FIG. 3 is a schematic of a single-polysilicon active pixel according to the present invention.
Figure 4:
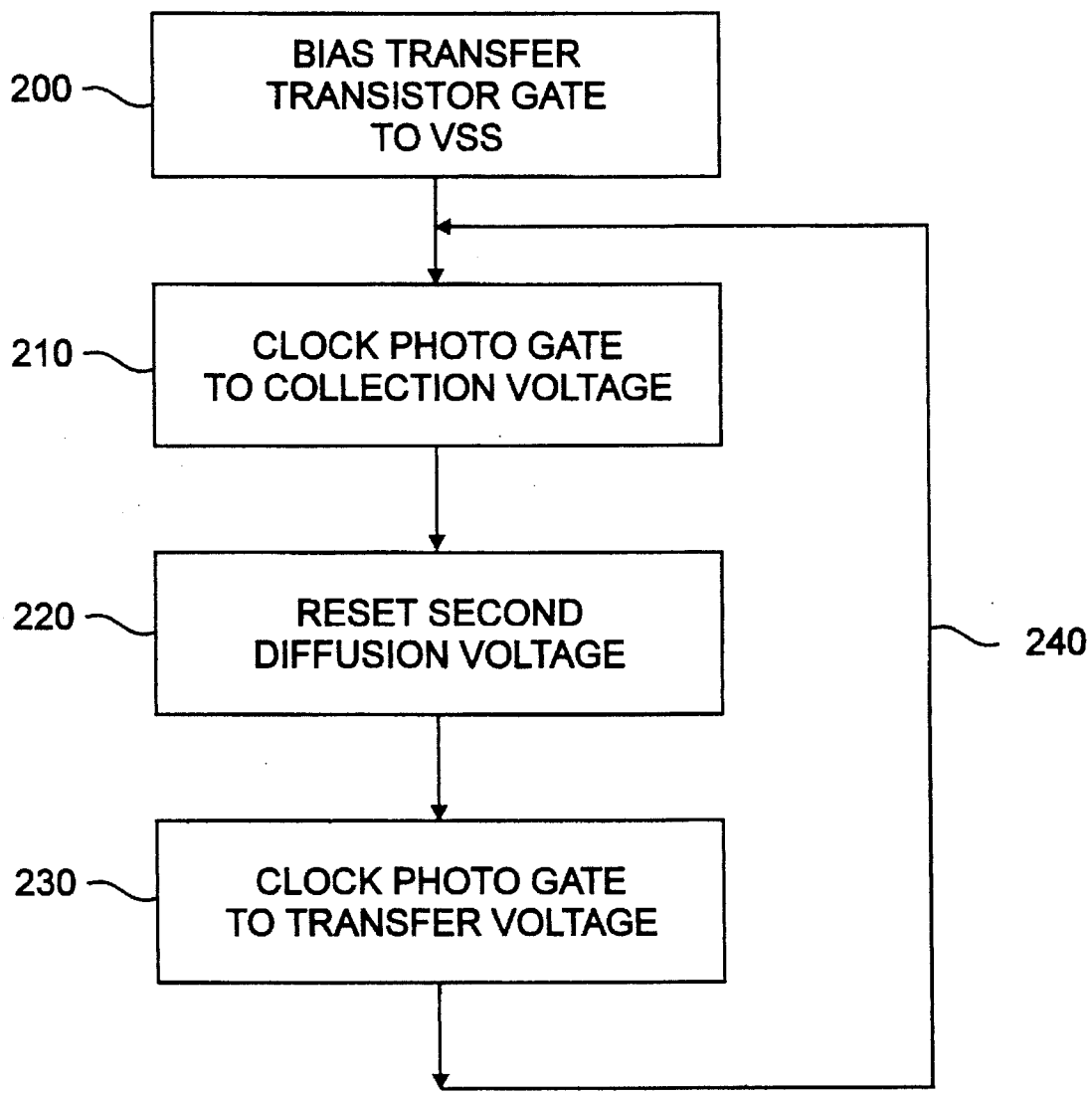
FIG. 4 is a flow chart illustrating a method of operating the single-polysilicon active pixel of FIG. 3 according to the present invention.

Before discussing the single-polysilicon CMOS active pixel 36 of the present invention which is shown in FIG. 3 and described in conjunction with a discussion of FIGS. 3 and 4 below, it will be useful to discuss the structure and operation of a typical double-polysilicon active pixel.

Figure 1:
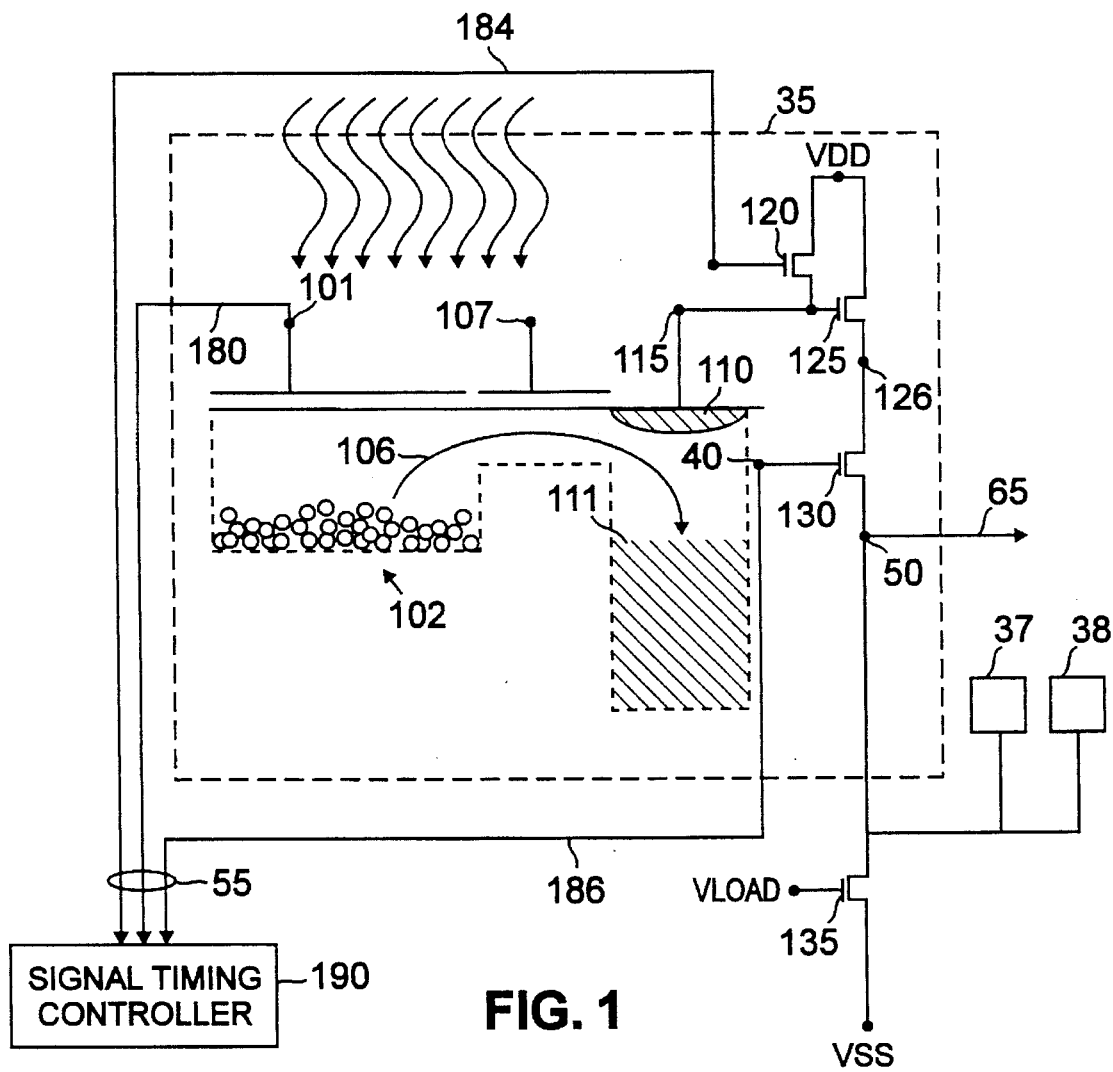
FIG. 1 is a prior art double polysilicon active pixel.
Figure 2:
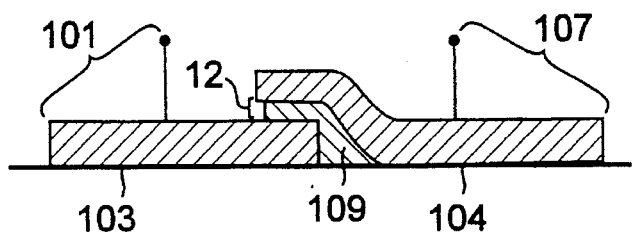
FIG. 2 provides detail as to the prior art two-layer structure of the active pixel of FIG. 1.

A schematic and electron transfer diagram of a prior art double-polysilicon CMOS active pixel 35 is shown in FIG. 1. FIG. 1 does not, however, illustrate the double polysilicon layer. Details of the double polysilicon layer are shown in FIG. 2.

Referring to FIG. 1, the active pixel 35 may be represented as a photo gate 101 charge-coupled to a transfer gate 107 that is charge-coupled to a diffusion region 110. The active pixel 35 further includes a reset transistor 120, a voltage-follower transistor 125, and a select transistor 130. A load, such as a suitably biased load transistor 135 may be included as part of the pixel. Typically, the active pixel 35 will be one of a plurality of such active pixels forming an array. As such, is it preferable to use a single load transistor 135 that is common to a column of active pixels, the column containing other active pixels such as the pixels 37 and 38, for example. While two additional pixels 37 and 38 are shown, it will be understood that many more pixels might be included depending upon the application of the invention.

A floating diffusion node 115 connects the diffusion region 110 to the reset transistor 120 and the voltage-follower transistor 125. The reset and voltage-follower transistors are further connected to a fixed voltage VDD which may be, for example, five volts. The reset transistor 120 is also connected to a reset control line 184 from an external signal timing controller 190. The voltage-follower transistor 125 is further connected to the select transistor 130 which is electrically connected to the load transistor 135.

The load transistor 135 is also connected to a fixed load voltage VLOAD, and a fixed voltage VSS which may be, for example, zero volts. The select transistor 130 is further connected to a select control line 186 from the signal timing controller 190. The signal timing controller may be a timing circuit, a combinational logic circuit or any other circuit capable of generating the necessary timing signals to the active pixel. The load voltage VLOAD should be adjusted such that a desired resistance is achieved across the load transistor 135 between the node 50 and the fixed voltage VSS. Accordingly, suitable alternatives for the load transistor 135 include a resistor or any other passive or active device that can provide the required electrical resistance when disposed between the node 50 and the fixed voltage VSS.

The active pixel output 50 that generates the output signal is the connection point between the select transistor 130 and load 135. The pixel output line 65 connects the pixel output 50 to an output circuit, such as the differential output circuit described in U.S. patent application Ser. No. 08/323,203 filed on Oct. 14, 1994 and incorporated herein by reference.

FIG. 1 includes an electron well diagram showing charge carriers 102 beneath the photo gate 101, charge carrier transfer arrow 106 and transferred charge carriers 111 in the diffusion region 110. This diagram represents the transfer of electrical charge from the region under the photo gate 101, which may be referred to as a photo site, to the transfer channel under the transfer gate 107 to the diffusion region 110. The transfer of charge will be discussed in more detail below.

The double-polysilicon structure, illustrated in FIG. 2, provides the electrical coupling required for transferring charge from the semiconductor substrate region 103 under the photo gate 101 and to the region 104 under the transfer gate 107. The substrate surface potential under the photo gate 101 is controlled by the voltage applied to the photo gate 101. Similarly, the substrate surface potential under the transfer gate 107 is controlled by the voltage applied to the transfer gate 107. Charge transfer from the region 103 to the region 104 and finally to the diffusion region 110 is achieved by applying a different voltage to the photo gate 101 and the transfer gate 107. If the gap 12 between the photo gate 101 and the transfer gate 107 is not narrow enough, the substrate potential under the gap 12 will constitute a barrier for the transfer of the charge.

To form the double polysilicon arrangement, a first layer of polysilicon is deposited on the substrate. The polysilicon is then patterned, and a contact is attached. The patterned polysilicon and contact collectively form the photo gate 101. A thin layer of an insulating material, typically silicon dioxide, is then grown. Next, a second layer of polysilicon is deposited. The second deposition is then patterned and a contact is attached. The patterned second deposition and the contact collectively form the transfer gate 107. The transfer gate 107 may overlap the photo gate 101. As shown in FIG. 2, the gap 12 separating the photo gate 101 and the transfer gate 107 is as narrow as the thickness of the silicon dioxide layer 109, which is typically on the order of a few tens of nanometers (nm). This narrow gap is essential for proper electrical coupling.

The active pixel may be either an n-channel device with electrons as the photo-generated charge carriers or a p-channel device with holes as the photo-generated charge carriers. For the balance of this description, the active pixel is assumed to be an n-channel device.

The signal timing controller 190 generates reset, select and photo gate control signals on lines 184, 186 and 180 causing the double-polysilicon active pixel to operate in two phases, integration and read-out. In the integration phase, the generated charge carriers are collected under the photo gate 101 for a predetermined period, referred to as the integration time. The integration time is dictated by the frame rate, or in other words, the number of times per second an image is updated, of the particular imaging application for which the active pixel is being used. For example, for commercial video applications, the frame rate is 30 frames per second. Thus, the integration time is about ⅟₃₀ of a second. The charge carriers are collected by clocking the photo gate 101 to a relatively high voltage level, such as VDD. During the integration phase, the transfer gate 107 is turned off.

In the read-out phase, the reset transistor 120 is pulsed on and off. This pulsing causes the potential of the diffusion node 115 to float at a level approximately equal to VDD less the threshold voltage. Then, the bias of the photo gate 101 is changed to approximately VSS, for example, 0 volts, causing charge transfer to the diffusion node 115. Charge transfer causes the potential of the diffusion node 115 to deviate from its value, approximately VDD, or in other words, the reset level, to another value which is dictated by the photo-generated charge. This other value is the signal level. The difference between the reset and signal levels is proportional to the incident light intensity and constitutes a video signal. A source follower comprising the voltage-follower transistor 125 and a load transistor 135 is used to buffer the diffusion node 115 from the output 50 of the active pixel sensor 35.

The select transistor 130 is used to select the pixel for read-out. In this phase, the transfer gate 107 is turned on to allow the transfer of the signal charge from under the photo gate 101 into the diffusion node 115. It is turned off, however, after completion of transfer and before the photo gate is clocked high for the following integration, ensuring that none of the signal charge will transfer back to the region under the photo gate 101 causing image lag.

The transfer gate 107 should be clocked on and off as described above for the optimum operation of the pixel. Alternatively, it is known to operate the pixel by biasing the transfer gate 107 to a voltage approximately halfway between VSS and VDD, or in other words, about 2 to 2.5 volts for a typical application so that the transfer channel is slightly conducting. This biasing simplifies operation by eliminating the need for one control clock and the associated driving circuitry. But, some of the charge signal may transfer back to under the photo gate 101 resulting in image lag, especially at high charge signal levels.

After the charge signal read-out, the output 50 signal is processed and amplified to provide the output video signal.

As previously noted, it is desirable to fabricate a CMOS active pixel based on a single polysilicon deposition. If, however, the photo gate 101 and the transfer gate 107 are formed in this manner, the gap between the photo gate and the transfer gate would be approximately one micron (μm). A one micron gap is too wide to provide the required electrical coupling. In one embodiment of the present invention, a CMOS active pixel that is based on a single polysilicon deposition is described.

One such single-polysilicon CMOS active pixel 36 according to the present invention is shown in FIG. 3. The elements of the single-polysilicon active pixel are similar to those of the double-polysilicon active pixel. Unlike the double-polysilicon active pixel, however, the single-polysilicon active pixel 36 has a coupling diffusion region 112 situated between the photo gate and the transfer gate. The coupling diffusion region 112, the diffusion region 110 and the transfer gate function collectively as a transistor, the coupling diffusion region as the source, and the diffusion region 110 as the drain. Thus, a transfer transistor 113 is formed comprising the coupling diffusion region 112, a diffusion region 110, and a transfer transistor gate 108. When properly biased as discussed further below, the coupling diffusion region functions as a conduction channel between the substrate regions 103 and 104, thus providing the required electrical coupling.

To form the photo gate 101 and the transfer transistor gate 108, a layer of polysilicon is deposited on a semiconductor substrate. The polysilicon is then patterned into two regions, using an appropriate mask, defining the photo gate 101 and the transfer transistor gate 108. Such a masking technique is well known to those skilled in the art. The coupling diffusion region 112 and the diffusion region 110 may suitably be formed in the same ways that the source and drain regions of a transistor are typically formed.

The coupling diffusion region 112 increases the kTC noise of the pixel. This effect can be minimized by making the coupling diffusion region capacitance as low as possible by making the area of the coupling diffusion region 112 as small as possible. It is expected that the coupling diffusion region capacitance can be made as low as a few femto-Farads, which equates to kTC noise on the order of a few tens of electrons.

The single-polysilicon CMOS active pixel 36 can be operated in a manner similar to that of the double-polysilicon CMOS active pixel. For example, the transfer transistor 113 may be turned on and off in a manner similar to that of the transfer gate 107. Alternatively, the transfer transistor may be biased with a potential approximately halfway between VSS and VDD so that it is slightly conducting. As in the case of the double-polysilicon active pixel, the latter operating mode results in a trade-off between operating simplicity and image lag.

In considering the single-polysilicon CMOS active pixel 36, a novel mode of operation has been discovered. As shown in FIG. 4 and described below, a presently preferred method of operation is as follows. In step 200, the transfer transistor gate 108 is biased to VSS, typically 0 volts. In step 210, the photo gate 101 is clocked high by applying a voltage such as 5 volts, and the photo-generated electrons are collected. During collection, the transfer transistor 113 is off. This is because the gate-to-source voltage is zero, and thus lower than the threshold voltage. In step 220, which occurs near the end of the integration time, the potential on the diffusion region 110 is reset. This resetting may be accomplished in the same manner as for the double-polysilicon pixel. For example, a reset transistor 120 may be pulsed on and off, causing the potential of the diffusion node 115 to float at a level approximately equal to VDD less the threshold voltage. Finally, in step 230, the photo gate 101 is clocked low by applying a voltage such as 0 volts, so that the electrons are transferred out of the region under the photo gate 101.

Without being limited to a particular theory of operation, it is believed that the pixel operates as follows when the transfer transistor gate is biased to VSS. Once the photo gate 101 is clocked low, the potential of the coupling diffusion region 112 goes slightly negative as it gets flooded by the electrons as they flow from the region under the photo gate 101. As the coupling diffusion region 112 potential decreases or becomes negative, the gate-to-source voltage of the transfer transistor 113 increases or becomes positive. Concurrently, because of the body effect, the threshold voltage of the transfer transistor 113 decreases. This mechanism remains in effect until the gate-to-source voltage exceeds the threshold voltage causing the transfer transistor 113 to turn on. As the transfer transistor turns on, the electrons flow from the coupling diffusion region 112 to the diffusion node 115. The flow of the electrons continues until the potential of the coupling diffusion region 112 decreases to its previous level, that is, its potential before the transfer of the signal electrons from the region under the photo gate 101, causing the transfer transistor 113 to turn off. The pixel is then ready to process another image by repeating the aforementioned steps as indicated by line 240.

Biasing the transfer transistor gate 108 to VSS causes the transfer transistor 113 to be off all the time except when the electrons are transferred from under the photo gate 101 into the diffusion node 115. This is effectively the same timing as if the transfer transistor 113 were clocked. Neither a clock nor its associated driving circuitry is required, however. Further, because the transfer transistor gate 108 is biased to VSS, i.e., nominally zero volts, there is no tendency to lag as when the transfer gate is biased to a voltage intermediate between VDD and VSS.

This mode of operation, which may be referred to as virtual clocking of the transfer transistor, is less sensitive to very low signal levels, for example, less than about one-half of one percent of the signal saturation level. If the signal level is in this range, the potential of the coupling diffusion region 112 will not become negative enough to cause the transfer transistor 113 to turn on. To this end, the capacitance of the coupling diffusion region 112 must therefore be made as low as possible.

Note that the potential of the coupling diffusion region 112 does not get sufficiently negative to cause the coupling diffusion/substrate junction to be forward biased. The transfer transistor 113 turns on before the coupling diffusion-substrate junction potential exceeds its built-in value, causing this junction to remain reverse-biased as the transfer transistor turns on and then off.

The single-polysilicon CMOS active pixel 36 of the present invention may be comprised of the same elements that are used in a double polysilicon active pixel for providing read-out, reset and buffering functions. For example, the single-polysilicon CMOS active pixel may incorporate a reset transistor 120, a voltage-follower transistor 125, select transistor 130 and a load, such as a suitably biased load transistor 135. Alternatively, the load transistor need not be included in the pixel 36 but may be common to a column of such pixels. These elements are arranged to operate in a manner similar to their operation in the double-polysilicon active pixel. The photo gate 101, the reset transistor 120 and the select transistor 130 are controlled, as appropriate, by a signal from the signal timing controller 190 sent over lines 180, 184 and 186, respectively.

A plurality of single polysilicon active pixels 36 according to the present invention may be arranged to form an imaging array which may be used as a solid-state camera. In an exemplary imaging array, one or more signal timing controllers may be employed to sequentially activate the pixels in each row generating a serial video signal corresponding to an image focused on the array.

We claim:

1. A single polysilicon CMOS active pixel for converting an optical signal to an electronic signal by applying a first collection voltage and a second transfer voltage, comprising:

a semiconductor substrate wherein charge carriers are generated from incident photonic energy;

a photo gate and a transfer transistor gate defined in a single layer of polysilicon disposed on the semiconductor substrate, the photo gate having a first and a second state wherein in the first state the first collection voltage is applied to the photo gate that causes the charge carriers to be stored in a first region within the semiconductor substrate beneath the photo gate, the stored charge carriers defining a signal, and in the second state the second transfer voltage is applied which results in movement of the charge carriers from the first region;

a transfer transistor comprising the transfer transistor gate, a first diffusion region and a second diffusion region, wherein the first diffusion region is located between the photo gate and the transfer transistor gate and functions as a source of the transfer transistor, and wherein the second diffusion region functions as a drain of the transfer transistor, the second diffusion region having a first potential and a second potential, wherein the second potential is a predetermined fixed value based on the first collection voltage and the first potential is a function of the second potential and the signal;

output electronics, electrically connected to the second diffusion region, which receives the signal from the second diffusion region and conducts the signal to processing electronics; and reset electronics to reset the second diffusion region to the second potential;

wherein in the first state of the transfer transistor, the transfer transistor is inactive so that the signal remains in the first region and in the second state the transfer transistor is active so that the signal flows from the first region to the first diffusion and to the output electronics.

2. The single polysilicon CMOS active pixel of claim 1 wherein the single polysilicon CMOS active pixel has an N-channel configuration.

3. The single polysilicon CMOS active pixel of claim 1 wherein the first state of the photo gate is an integration period.

4. The single polysilicon CMOS active pixel of claim 1 wherein the first voltage is 5 volts.

5. The single polysilicon CMOS active pixel of claim 1 wherein the second voltage is 0 volts.

6. The single polysilicon CMOS active pixel of claim 1 wherein the second potential is 5 volts minus a voltage drop across the reset electronics.

7. The single polysilicon CMOS active pixel of claim 1 wherein the output electronics comprise a voltage follower transistor electrically connected to a select transistor, wherein the voltage follower transistor is electrically connected to the second diffusion.

8. The single polysilicon CMOS active pixel of claim 1 wherein the reset electronics comprises a reset transistor electrically connected to the second diffusion.

9. The single polysilicon CMOS active pixel of claim 1 wherein the first region is a photo site.

10. A method for operating a single-polysilicon CMOS n-channel active pixel having a photo gate, a clock, and a transfer transistor which has a transfer transistor gate and a diffusion node, the single-polysilicon CMOS active pixel operable by a first voltage and a second voltage, comprising the steps of:

(a) biasing the transfer transistor to the second voltage;

(b) clocking the photo gate to the first voltage, the first voltage on the photo gate being maintained until a first desired period of time has elapsed, wherein a signal is stored in a first region during the first desired period of time;

(c) resetting the diffusion node to a third voltage based on the first voltage;

(d) clocking the photo gate to the second voltage when the first desired period of time has elapsed, and maintaining the second voltage until a second desired period of time has elapsed, wherein, during the second desired period of time, the signal is transferred out of the first region to the diffusion node changing the third voltage on the diffusion node; and (e) repeating steps (b)–(d).

11. The method of claim 10 wherein the single polysilicon active pixel is n-channel.

12. The method of claim 10 wherein the first voltage has a higher potential than the second voltage.

13. The method of claim 10 wherein the first voltage is 5 volts and the second voltage is 0 volts.

14. The method of claim 10 wherein the second voltage is 0 volts.

15. The method of claim 10 wherein the first desired period of time is about 30 milliseconds.

16. The method of claim 10 wherein the step of resetting the diffusion node comprises activating a reset transistor, which reset transistor has a drain biased to the first voltage and has a source electrically connected to the diffusion node.

* * * * *